United States Patent
Tkacik et al.

(10) Patent No.: US 11,620,184 B2
(45) Date of Patent: Apr. 4, 2023

(54) RUNTIME INTEGRITY CHECKING FOR A MEMORY SYSTEM

(71) Applicant: NXP B.V., Eindhoven (NL)

(72) Inventors: Thomas E. Tkacik, Phoenix, AZ (US); Geoffrey Paul Waters, Austin, TX (US); James Andrew Welker, Leander, TX (US); Mohit Mongia, Noida (IN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/402,755

(22) Filed: Aug. 16, 2021

(65) Prior Publication Data

US 2023/0051590 A1  Feb. 16, 2023

(51) Int. Cl.
*G06F 11/10* (2006.01)
*G06F 11/00* (2006.01)
*G06F 3/06* (2006.01)

(52) U.S. Cl.
CPC ........ *G06F 11/1004* (2013.01); *G06F 3/0619* (2013.01); *G06F 3/0652* (2013.01); *G06F 3/0659* (2013.01); *G06F 3/0673* (2013.01); *G06F 11/1076* (2013.01)

(58) Field of Classification Search
CPC .. G06F 11/1004; G06F 3/0619; G06F 3/0652; G06F 3/0659; G06F 3/0673; G06F 11/1076
See application file for complete search history.

(56) References Cited

U.S. PATENT DOCUMENTS

| | | | |
|---|---|---|---|
| 6,240,183 B1 | 5/2001 | Marchant | |
| 7,401,234 B2 | 7/2008 | Case et al. | |
| 7,472,285 B2 | 12/2008 | Graunke et al. | |
| 7,962,738 B2 | 6/2011 | Zimmer et al. | |
| 9,146,808 B1* | 9/2015 | Butler | G11C 15/00 |
| 9,152,577 B2 | 10/2015 | Rodgers et al. | |
| 9,954,681 B2 | 4/2018 | Case et al. | |
| 10,157,093 B2* | 12/2018 | Cunningham | G06F 11/0751 |
| 10,157,153 B2 | 12/2018 | Shacham et al. | |
| 10,606,750 B1* | 3/2020 | Mattina | G06F 12/122 |
| 10,749,672 B2 | 8/2020 | Lee et al. | |

(Continued)

OTHER PUBLICATIONS

U.S. Appl. No. 17/246,042, filed Apr. 30, 2021, "Inline Encryption/Decryption for a Memory Controller".

*Primary Examiner* — Justin R Knapp

(57) ABSTRACT

Various embodiments relate to a memory controller, including: a memory interface connected to a memory; an address and command logic connected to the memory interface and a command interface, wherein the address and control logic is configured to receive a memory read request; a memory scrubber configured to cycle through memory locations and to read data from those locations; a region selector configured to determine when a memory location read by the memory scrubber is within an integrity checked memory region; a runtime integrity check (RTIC) engine connected to a read data path of the memory interface, wherein the RTIC engine is configured to calculate an integrity check value for the RTIC region using data read from the checked memory region by the memory scrubber; and a RTIC controller configured to compare the calculated integrity check value for the checked memory region to a reference integrity check value for the checked memory region.

19 Claims, 3 Drawing Sheets

(56) References Cited

U.S. PATENT DOCUMENTS

| | | | |
|---|---|---|---|
| 2005/0193217 A1* | 9/2005 | Case | G06F 21/57 |
| | | | 726/22 |
| 2011/0154061 A1 | 6/2011 | Chilukuri et al. | |
| 2014/0006859 A1* | 1/2014 | Ryu | G06F 11/106 |
| | | | 714/21 |
| 2015/0278037 A1* | 10/2015 | Wada | G06F 11/1484 |
| | | | 711/143 |
| 2019/0095647 A1 | 3/2019 | Merli et al. | |
| 2020/0159969 A1* | 5/2020 | Shanbhogue | G06F 13/4282 |
| 2021/0157906 A1* | 5/2021 | Shaon | G06F 21/54 |

* cited by examiner

RUNTIME INTEGRITY CHECKING FOR A MEMORY SYSTEM

TECHNICAL FIELD

Various exemplary embodiments disclosed herein relate generally to check the integrity of a memory system during runtime.

SUMMARY

A summary of various exemplary embodiments is presented below. Some simplifications and omissions may be made in the following summary, which is intended to highlight and introduce some aspects of the various exemplary embodiments, but not to limit the scope of the invention. Detailed descriptions of an exemplary embodiment adequate to allow those of ordinary skill in the art to make and use the inventive concepts will follow in later sections.

Various embodiments relate to a memory controller, including: a memory interface connected to a memory; an address and command logic connected to the memory interface and a command interface, wherein the address and control logic is configured to receive a memory read request; a memory scrubber configured to cycle through memory locations and to read data from those locations; a region selector configured to determine when a memory location read by the memory scrubber is within a checked memory region; a RTIC engine connected to a read data path of the memory interface, wherein the RTIC engine is configured to calculate an integrity check value for the checked memory region using data read from the memory by the memory scrubber; and a RTIC controller configured to compare the calculated integrity check value for the checked memory region to a reference integrity check value.

Various embodiments are described, wherein calculating an integrity check value includes calculating a hash function.

Various embodiments are described, wherein the RTIC engine includes a buffer configured to buffer data read from the RTIC region by the memory scrubber.

Various embodiments are described, wherein the reference integrity check value for the checked memory region is stored in the RTIC controller and is precomputed.

Various embodiments are described, wherein the reference integrity check value for the checked memory region is computed the first time the RTIC engine calculates the integrity check value for the checked memory region and is stored in the RTIC controller.

Various embodiments are described, wherein RTIC controller is configured to initiate the RTIC engine when memory scrubber first reads a portion of the checked memory region.

Various embodiments are described, wherein RTIC controller is configured to indicate to the RTIC engine when memory scrubber reads a last portion of the checked memory region.

Various embodiments are described, wherein a configuration bit is associated with the checked memory region indicating whether or not the RTIC engine is to calculate the integrity check value for the checked memory region.

Memory controller of claim 8, wherein the configuration bit may be sticky.

Various embodiments are described, wherein the RTIC controller is configured to produce an error signal when the calculated integrity check value for the checked memory region is not equal to the reference integrity check value.

Various embodiments are described, wherein the memory includes a plurality of checked memory regions.

Various embodiments are described, wherein region selector is configured to identify which of the plurality of the checked memory regions is associated with the memory location selected by the memory scrubber and provides to the RTIC controller the identity of the identified checked memory region.

Various embodiments are described, wherein the memory scrubber is configured to: cycle through memory locations at first rate; and cycle through memory locations at second rate to calculate the integrity check value using the RTIC engine, wherein the first rate and the second rate are different.

Various embodiments are described, wherein the memory scrubber is configured to: cycle through memory locations at first rate to correct data errors using an error correction code; and cycle through memory locations associated with the checked memory region at second rate to calculate the integrity check value using the RTIC engine, wherein the first rate and the second rate are different.

Further various embodiments relate to a method for checking the integrity of a memory region in a memory, including: cycling, by a memory scrubber, through memory locations and reading data from those locations; determining, by a region selector, when a memory location read by the memory scrubber is within a checked memory region; calculating, by a RTIC engine, an integrity check value for the checked memory region using data read from the memory by the memory scrubber; and comparing, by a RTIC controller, the calculated integrity check value for the checked memory region to a reference integrity check value.

Various embodiments are described, further including initiating, by RTIC controller, the RTIC engine when memory scrubber first reads a portion of the checked memory region.

Various embodiments are described, indicating, by RTIC controller, to the RTIC engine when memory scrubber reads a last portion of the checked memory region.

Various embodiments are described, wherein a configuration bit is associated with the checked memory region indicating whether or not the RTIC engine is to calculate the integrity check value for the checked memory region.

Various embodiments are described, producing, by the RTIC controller, an error signal when the calculated integrity check value for the checked memory region is not equal to the reference integrity check value.

Various embodiments are described, wherein the memory includes a plurality of checked memory regions.

Various embodiments are described, identifying, by region selector, which of the plurality of the checked memory regions is associated with the memory location selected by the memory scrubber and provides to the RTIC controller the identity of the identified checked memory region.

BRIEF DESCRIPTION OF THE DRAWINGS

In order to better understand various exemplary embodiments, reference is made to the accompanying drawings, wherein.

To facilitate understanding, identical reference numerals have been used to designate elements having substantially the same or similar structure and/or substantially the same or similar function.

DETAILED DESCRIPTION

Figure 1:
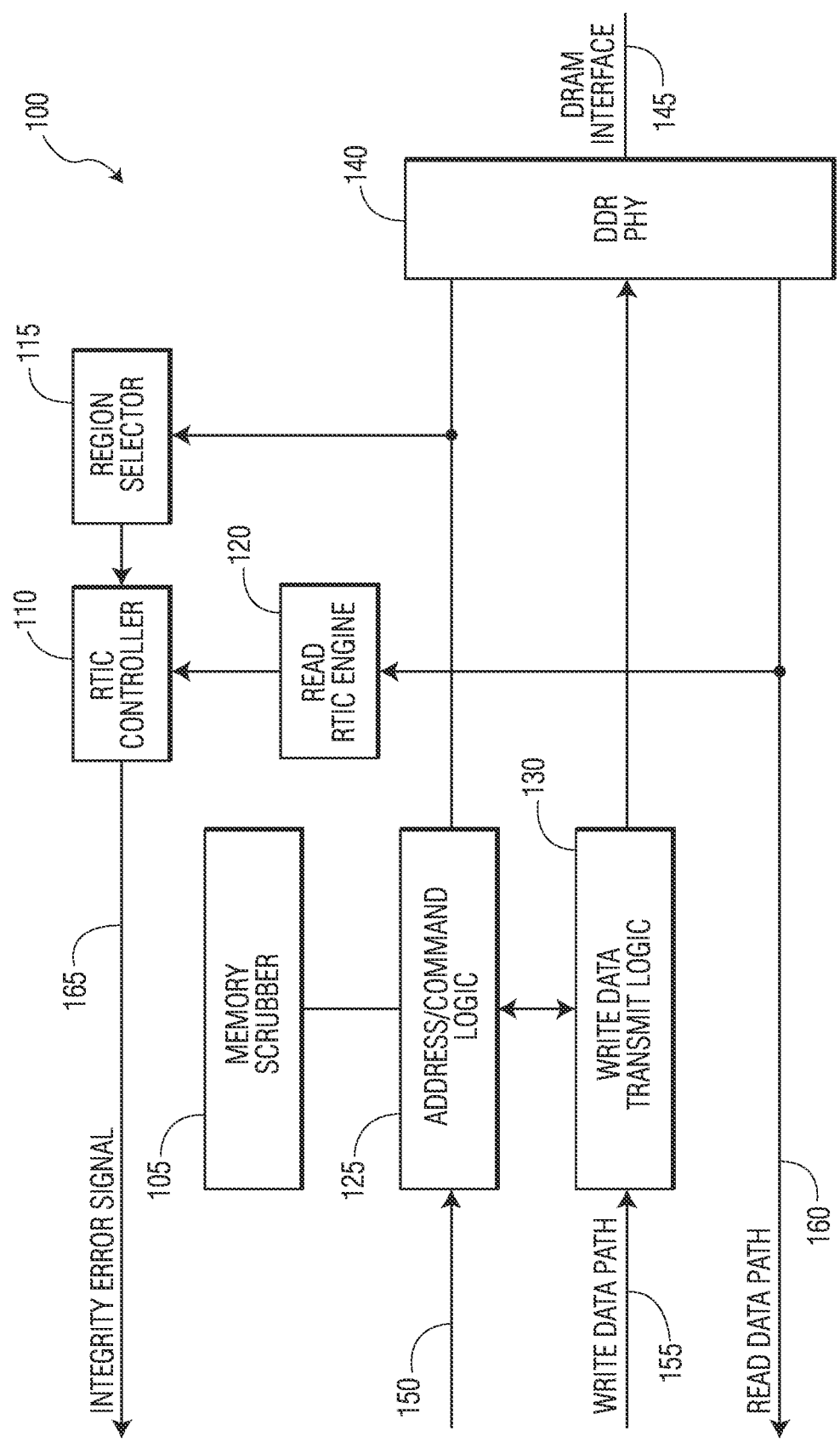
FIG. 1 illustrates a memory controller implementing the runtime integrity checking function.

The description and drawings illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments.

Various data loaded into a memory may be the subject of attack, misconfiguration, or memory errors. In such cases the modified data in the memory may cause the related system to not function correctly or to be compromised. Such data may include executable software such as the operating system or other applications executed by a processor. In other cases, the data may be key configuration data used by various software in the system. For example, various elements of the operating system may use system parameters that configure the operation of the system, and such parameters may be a target for an attacker. In another example, machine learning models implemented using neural networks may include thousands or millions of weights that define the neural network. These parameters may also be the target of an attacker.

Such data is likely written to memory once either at system boot time or when an application is started. It is expected to remain constant until the system powers down or the application is stopped by the OS. Unexpected modifications of the memory may go unnoticed for a long time causing the system to function incorrectly. Runtime integrity checking (RTIC) is a periodic checking of the memory contents against the expected value. Portions of the memory may be checked to confirm that the contents of system memory have not been modified either due to a security attack, a serious misconfiguration of system access controls combined with a software error, or memory hardware errors. Runtime checking of memory is only appropriate for memory that is expected to be constant. It is not appropriate for data that changes, such as program data that is in the stack or heap. Current implementations of memory integrity checking use strong hashing algorithms (such as for example SHA-256) and may be implemented only in software, in firmware running in a security subsystem, or in look-aside hardware accelerator. A complication with all such approaches is the need for the integrity checking to have memory access permissions to all memory regions where the integrity checking function needs to be applied. Further, the integrity checking will take up memory access bandwidth by reading the memory locations storing key data in order to perform the integrity check.

Embodiments of a memory controller implementing the integrity checking will be described herein. In this approach the integrity checking function is behind the memory access controls that makes it easier to carry out the integrity checking without affecting the memory access bandwidth.

The memory controller implementing integrity checking combines a hardware memory scrubber also used for ECC memory integrity protection against random bit flips, a region generator that determines if a protective action is to be taken on an address initiated by the scrubber, and the checking logic to perform the hash/MAC based run time integrity check on system memory. By combining the integrity checking with ECC memory scrubbing, RTIC based security occurs transparently to system software, with no additional system memory bandwidth required for checking the integrity of memory. Using a strong hash algorithm allows runtime integrity checking to detect memory errors beyond what ECC can detect and correct. It also prevents malicious attacks by preventing an attacker from being able to make specific changes to the memory that could bypass the ECC's checking capability.

FIG. 1 illustrates a memory controller implementing memory integrity checking. The memory controller 100 includes memory scrubber 105, RTIC controller 110, region selector 115, read RTIC engine 120, address/command logic 125, write data logic 130, and DDR PHY 140.

The basic read and write functionality of the memory controller 100 will now be described. The memory controller 100 may be connected to the DDR memory using one or more suitable communications buses, such as the DDR PHY 140 which implements the DRAM Interface 145. The DRAM interface 145 may use any available memory interface protocol. Accordingly, the memory controller 100 may have a DRAM command interface that is part of the DRAM interface 145 where commands are sent to the DRAM and status and other information is received back from the DRAM. DRAM interface 145 also has a write data channel interface where data to be written to the DRAM is output. The DRAM interface 145 has a read data channel interface where data read from the DRAM is received.

The address/command logic 125 controls the operation of the memory controller 100. The address/command logic 125 receives address and command information from an address channel 150. For example, when data is to be written, a write command and the address to write to is received by the address/command logic 125 from a core or another bus master via the address channel 150. The data to be written is received on the write data channel 155 and the write data transmit logic 130 coordinates with the address/command logic 125 to provide the data to be written to the DDR PHY 140 which then writes the data in the DRAM.

When data is to be read, a read command and the address of the data in the DRAM is received by the address/command logic 125 from the core or another bus master via the address channel 150. The address/command logic 125 sends a read command and the address to the DDR PHY 140 which then reads the data from the DRAM. The DDR PHY 140 transmits the data read from the DRAM to the read RTIC engine 120. The data read from the DRAM is also passed to the read data channel 160.

The read RTIC engine 120 is a look-aside hardware accelerator implementing a strong hash function. The memory scrubber 105, RTIC controller 110, region selector 115, and the read RTIC engine 120 work together to implement integrity checking for the memory.

The memory scrubber 105 periodically generates requests to the address/command logic 125 to read values from the DRAM, stepping through memory one address at a time. It can be used for DDR memory refresh where it simply performs a memory read on each address. Memory scrubbing can also include reading from each memory location, correcting bit errors (if any) with an error-correcting code (ECC), and writing the corrected data back to the same memory location when an error is detected. This scrubbing of memory is done to correct errors that may occur in memory due to, for example, radiation. Memory scrubbing is performed as a background task that is carried out when there is idle time or as a low priority task. The memory scrubber 105 may simply cycle through the memory in a sequential order. When a memory location is to be scrubbed, the memory scrubber 105 sends a refresh request to the address/command logic 125. In other embodiments, the locations may only be scrubbed every n refreshes or when the memory controller 100 wants to schedule the read for scrubbing. The address/command logic 125 sends a read request to the DRAM for the location to be scrubbed. Then the data read from the DRAM is checked, and if an error is found the data is corrected. The corrected data and ECC is then written back to the DRAM. The memory scrubber 105 cycles through the memory refreshing the whole memory periodically. The rate at which the memory is refreshed is based upon the size of the memory and the availability of time to perform the refresh operation. The time to completely scrub the memory may be of the order of minutes or hours, but other rates are possible as well. In addition, the memory scrubber 105 may be used in cases where ECC is not enabled to carry out memory integrity checking. ECC enablement is not a prerequisite to run the memory scrubber for integrity checking.

Figure 2:
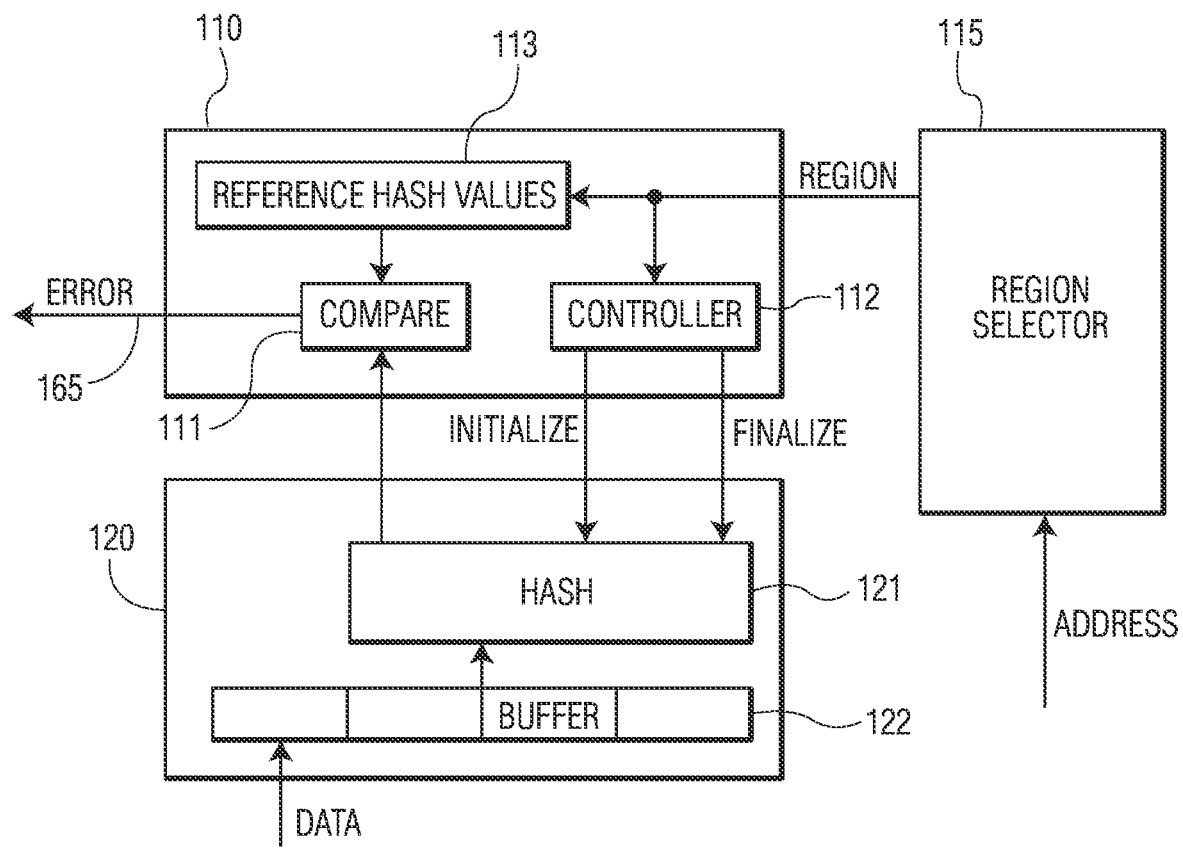
FIG. 2 illustrates additional details for the region selector, RTIC controller, and read RTIC engine.

FIG. 2 illustrates additional details for the region selector 115, RTIC controller 110, and read RTIC engine 120. The region selector 115 contains the information to translate an address to the memory region it belongs to. This would include a start and end address. The region selector passes the region number to the RTIC controller 110. The RTIC controller 110 includes a controller 112 that determines that an address is the start of a new region (perhaps because the region number has changed), and the controller 112 initializes the read RTIC engine 120. The read RTIC engine 120 receives data from the memory. The hashing algorithm 121 may use a large data block, (e.g., SHA-256 uses a 64-byte block), and the data from memory may be shorter than this. Thus, the read RTIC engine 120 includes a buffer 122 to store partial data blocks. When the buffer 122 is full, the hashing algorithm 121 will process the data block and update its internal hash state. When the controller 112 sees the last address of a region (perhaps because the region number has changed), the controller 112 finalizes the hashing function 121. The read RTIC engine 120 then sends the computed hash value to the RITC controller 110. The RTIC controller 110 includes a comparator 111 that will compare the computed hash value with one of its reference hash values 113 (selected by the region number). If the two values differ, the RTIC controller 110 will assert an error signal 165. The region information in the region selector 115 and the reference hash values 113 are configured by initialization software.

Figure 3:
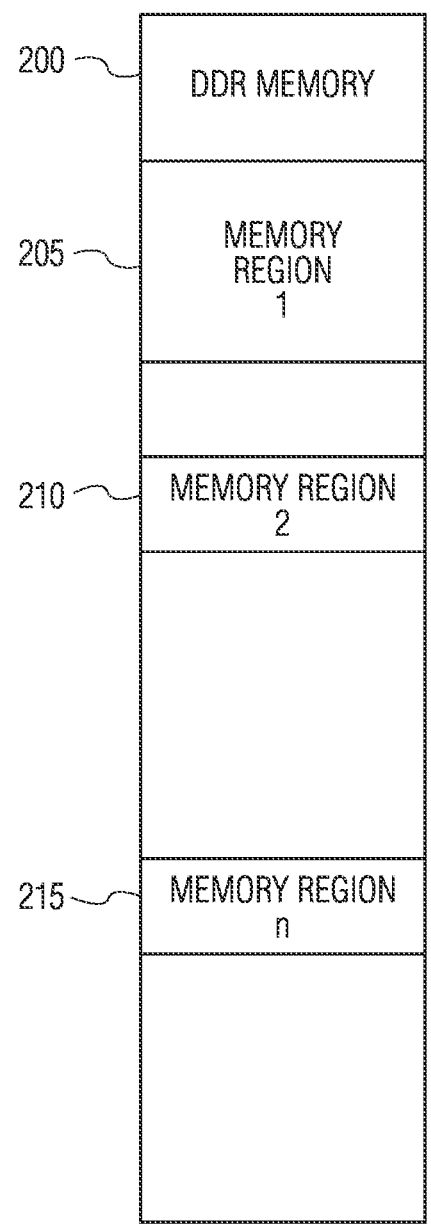
FIG. 3 illustrates the DDR memory.

The scanning function of the memory scrubber 105 may be used in order to drive the RTIC function in the memory controller 100. FIG. 3 illustrates the DDR memory 200. The DDR memory 200 may include various memory regions 205, 210, 215 that include data that requires integrity checking. Each region has a start and an end address. The region selector 115 monitors commands from the address/command logic 125 to the DDR PHY 140 to identify commands that are from the memory scrubber 105. When a memory scrubber read request is made, the region selector 115 determines if the address of the memory to be read is in any of the memory regions 205, 210, 215 defined in the DDR memory 200. If so, then the region selector 115 instructs the read RTIC controller 110 that the data read by the memory scrubber 105 is to be used to calculate the integrity check value which will often involve the calculation of a hash over the memory region. When the memory scrubber 105 first enters a memory region to be checked, the region selector 115 will cause the read RTIC controller 110 to initiate the integrity calculation. Likewise, when the region selector 115 determines that the memory scrubber 105 has finished scanning the checked memory region, the region selector 115 indicates that the end of the memory region has been reached, and the read RTIC engine 120 calculates the final integrity check value. The RTIC controller then compares it to the reference integrity check values. The reference integrity check values are stored in the RTIC controller 110. If the calculated integrity check value is equal to the reference integrity check value, then nothing needs to be done. If the values do not match, then the RTIC controller 110 produces an error signal 165 that indicates the failure of the integrity check. The error signal 165 may be used as an interrupt where a program is interrupted and then reloaded. In other cases, the error signal may trigger a complete hardware reset. This may be done for example if the operating system fails an integrity check. Alternatively, the error signal 165 may be sent to a system hardware event handler.

The RTIC engine 120 may include a buffer for read data. This may be needed when the read block size used by the memory scrubber 105 is different in size from the block size used by the integrity check algorithm. For example, if SHA-256 is used, the input blocks are 512 bits. If the memory scrubber processes smaller blocks such as 128 bits, then it takes four memory scrubber reads to get 512 bits of input data for the SHA-256 hash function. The first block would then be buffered while waiting for the next memory read.

The RTIC controller 110 may store reference integrity check values for each of the checked memory regions 205, 210, 215. These reference integrity check values may be pre-calculated. That is the integrity check value may be calculated by the memory controller, using for example the RTIC engine 120, or another processor before the data associated with the checked memory region is stored in the memory. The pre-calculated integrity check value may also be a part of a digital signature for the data placed in the checked memory region. In another embodiment, the data may be loaded into the checked memory region, and the first time the integrity check is run the computed integrity check value is used as a reference value which is then stored in the RTIC controller 110.

Memory integrity checking is described above as occurring in conjunction with the memory ECC correction function. If there is a need for integrity checking to occur at a different rate than ECC bit error correction, the integrity checking process may use a second version of the logic in the memory scrubber to scan the memory independent of the ECC memory scrubbing to perform the integrity checking at a different rate. In such a situation, the second version of the memory scrubber would scan only the RTIC regions that are defined in the memory 200 rather than all of memory.

In other embodiments each of the checked memory regions may have an associated configuration bit. These configuration bits indicate whether or not integrity checking is performed on the associated checked memory region. The configuration bits may be sticky, in that once set they may remain set until a hardware reset occurs, thus preventing the integrity checking process from being disabled.

In one embodiment, when a new checked memory region is defined, if the memory scrubber 105 is currently scrubbing the memory in the newly defined memory region, the region selector 115 and RTIC 110 will wait until the next pass through the new checked memory region to start the integrity checking for the new region. In another embodiment, the scrubbing may immediately reset and start scrubbing the new region from the beginning.

In the memory controller 100 the RTIC controller 110, region selector 115, read RTIC engine 120, and the memory scrubber 105 are shown as separate functions each with their own hardware logic implementing the function. In some embodiments, hardware logic may be combined to carry out any combination of these various functions.

It should be appreciated by those skilled in the art that any block diagrams herein represent conceptual views of illustrative circuitry embodying the principles of the invention.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

What is claimed is:

1. A memory controller, comprising:
a memory interface connected to a memory;
an address and command logic connected to the memory interface and a command interface, wherein the address and control logic is configured to receive a memory read request;
a memory scrubber configured to cycle through memory locations and to read data from the memory locations;
a region selector configured to determine when a memory location read by the memory scrubber is within a checked memory region;
a runtime integrity checking (RTIC) engine connected to a read data path of the memory interface, wherein the RTIC engine is configured to calculate an integrity check value for the checked memory region using the data read from the memory by the memory scrubber; and
a RTIC controller configured to compare the calculated integrity check value for the checked memory region to a reference integrity check value, wherein the RTIC controller is configured to produce an error signal when the calculated integrity check value for the checked memory region is not equal to the reference integrity check value.

2. The memory controller of claim 1, wherein calculating an integrity check value includes calculating a hash function.

3. The memory controller of claim 1, wherein the RTIC engine includes a buffer configured to buffer data read from the memory locations read by the memory scrubber.

4. The memory controller of claim 1, wherein the reference integrity check value for the checked memory region is stored in the RTIC controller and is precomputed.

5. The memory controller of claim 1, wherein the reference integrity check value for the checked memory region is computed a first time the RTIC engine calculates the integrity check value for the checked memory region and is stored in the RTIC controller.

6. The memory controller of claim 1, wherein the RTIC controller is configured to initiate the RTIC engine when the memory scrubber first reads a portion of the checked memory region.

7. The memory controller of claim 1, wherein the RTIC controller is configured to indicate to the RTIC engine when the memory scrubber reads a last portion of the checked memory region.

8. The memory controller of claim 1, wherein a configuration bit is associated with the checked memory region indicating whether or not the RTIC engine is to calculate the integrity check value for the checked memory region.

9. The memory controller of claim 8, wherein the configuration bit may be sticky.

10. The memory controller of claim 1, wherein the memory includes a plurality of checked memory regions.

11. The memory controller of claim 10, wherein the region selector is configured to identify which of the plurality of the checked memory regions is associated with a memory location selected by the memory scrubber and provides to the RTIC controller an identity of an identified checked memory region.

12. The memory controller of claim 1, wherein the memory scrubber is configured to:
cycle through the memory locations at a first rate; and
cycle through the memory locations at a second rate to calculate the integrity check value using the RTIC engine, wherein the first rate and the second rate are different.

13. The memory controller of claim 1, wherein the memory scrubber is configured to:
cycle through memory locations at a first rate to correct data errors using an error correction code; and
cycle through the memory locations associated with the checked memory region at a second rate to calculate the integrity check value using the RTIC engine, wherein the first rate and the second rate are different.

14. A method for checking the integrity of a memory region in a memory, comprising:
cycling, by a memory scrubber, through memory locations and reading data from those the memory locations;
determining, by a region selector, when a memory location read by the memory scrubber is within a checked memory region;
calculating, by a runtime integrity checking (RTIC) engine, an integrity check value for the checked memory region using data read from the memory by the memory scrubber; and
comparing, by a RTIC controller, the calculated integrity check value for the checked memory region to a reference integrity check value, wherein the RTIC controller produces an error signal when the calculated integrity check value for the checked memory region is not equal to the reference integrity check value.

15. The method of claim 14 further comprising initiating, by the RTIC controller, the RTIC engine when the memory scrubber first reads a portion of the checked memory region.

16. The method of claim 14, further comprising indicating, by the RTIC controller, to the RTIC engine when the memory scrubber reads a last portion of the checked memory region.

17. The method of claim 14, wherein a configuration bit is associated with the checked memory region indicating whether or not the RTIC engine is to calculate the integrity check value for the checked memory region.

18. The method of claim 14, wherein the memory includes a plurality of checked memory regions.

19. The method of claim 18, identifying, by the region selector, which of the plurality of the checked memory regions is associated with a memory location selected by the memory scrubber and provides to the RTIC controller an identity of the identified checked memory region.

* * * * *